(12) United States Patent
Zheltov et al.

(10) Patent No.: US 6,891,976 B2
(45) Date of Patent: May 10, 2005

(54) METHOD TO DECODE VARIABLE LENGTH CODES WITH REGULAR BIT PATTERN PREFIXES

(75) Inventors: Sergey N. Zheltov, N. Novgorod (RU); Stanislav V. Bratanov, N. Novgorod (RU)

(73) Assignee: Intel Corporation, Santa Clara, CA (US)

( * ) Notice: Subject to any disclaimer, the term of this patent is extended or adjusted under 35 U.S.C. 154(b) by 594 days.

(21) Appl. No.: 10/096,792

(22) Filed: Mar. 12, 2002

(65) Prior Publication Data

US 2003/0174898 A1 Sep. 18, 2003

(51) Int. Cl.[7] .............................. G06K 9/36; H03M 7/40
(52) U.S. Cl. ......................................... 382/246; 341/67
(58) Field of Search .............................. 382/233, 244, 382/245, 246; 341/65, 67, 95, 106; 375/240.23, 240.25; 358/426.13, 427

(56) References Cited

U.S. PATENT DOCUMENTS

| | | | | |
|---|---|---|---|---|
| 3,717,851 A | * | 2/1973 | Cocke et al. ............... 711/220 |
| 4,475,174 A | | 10/1984 | Kanayama | |
| 5,404,139 A | * | 4/1995 | Bhandari et al. ............. 341/81 |
| 5,559,831 A | | 9/1996 | Keith | |
| 5,754,128 A | * | 5/1998 | Kang ........................... 341/67 |
| 5,973,626 A | * | 10/1999 | Berger et al. .................. 341/65 |
| 5,990,812 A | * | 11/1999 | Bakhmutsky ................. 341/67 |
| 6,008,745 A | | 12/1999 | Zandi et al. | |
| 6,219,457 B1 | | 4/2001 | Potu | |
| 6,285,789 B1 | * | 9/2001 | Kim ........................... 382/233 |
| 6,518,895 B1 | * | 2/2003 | Weiss et al. .................. 341/67 |
| 6,563,441 B1 | * | 5/2003 | Gold ........................... 341/67 |
| 6,771,196 B2 | * | 8/2004 | Hsiun ......................... 341/106 |

* cited by examiner

*Primary Examiner*—Andrew W. Johns
*Assistant Examiner*—Amir Alavi
(74) *Attorney, Agent, or Firm*—Steven P. Skabrat

(57) ABSTRACT

Decoding variable length codes having regular bit pattern prefixes enables faster decoding of variable length codes, especially in systems that provide bit or bit mask search capabilities. An embodiment of the present invention determines a code prefix type, and calculates a length of the code prefix. A first data structure may be provided to associate the maximal number of bits in a variable length code with the length of the code prefix, and to locate further decoding data in accordance with the prefix length and type. A bit stream may be read according to the maximal length obtained. An additional data structure may be provided to retrieve a decoded value and the actual length of a variable length code being decoded. This data structure may be indexed with the value of the bit combination read from the bit stream. In case the actual length of the variable length code is less than the maximal length, the excess bits may be returned to the bit stream.

27 Claims, 3 Drawing Sheets

METHOD TO DECODE VARIABLE LENGTH CODES WITH REGULAR BIT PATTERN PREFIXES

A portion of the disclosure of this patent document contains material that is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND

1. Field

The present invention relates generally to decoding of variable-length prefix codes, e.g., Huffman codes, and, more specifically, to a new decoding scheme for codes whose prefixes are formed by a regular bit pattern.

2. Description

Entropy coding is a widely used data compression technique that many video and audio coding standards are based on. The theoretical basis of entropy coding states that a compression effect can be reached when the most frequently used data are coded with a fewer number of bits than the number of bits denoting the less frequently appearing data. This approach results in coded data streams composed of codes having different lengths.

There are a number of methods to form such variable length codes. One popular method uses a prefixed coding in which a code consists of a prefix that allows a decoding system to distinguish between different codes, and several significant bits representing a particular value (e.g., Huffman coding).

While most coding standards employ Huffman codes with prefixes composed of a series of '1' or '0' bits in their coding schemes, some standards (e.g., ISO/IEC 14496-2, Moving Pictures Experts Group (MPEG)-4 coding standard, Visual) allow for codes prefixed with a series of longer bit patterns. As a general rule, the number of bits that comprise a variable length code depends on the number of bits that comprise the prefix of the code.

Therefore, a need exists for the capability to provide high speed decoding of variable length codes prefixed with regular combinations of bits.

BRIEF DESCRIPTION OF THE DRAWINGS

The features and advantages of the present invention will become apparent from the following detailed description of the present invention in which.

DETAILED DESCRIPTION

An embodiment of the present invention is a method of implementing a decoder for variable length codes that have prefixes composed of regular bit patterns. According to the disclosed method, the bit pattern length and type may be determined for a variable length code. The code may then be scanned for a selected bit pattern in order to estimate the code prefix length. The bit pattern type may be used to locate a table structure to be further indexed with the code prefix length. The table structure provides information on the maximal number of significant bits that follow the code prefix and correspond to the specific prefix length, along with information to locate a decoded value associated with a variable length code. If the bit pattern is one bit long, the bit immediately following the code prefix may be ignored. The number of bits (that is equal to the maximal number obtained) may be read from a bit stream. The value of the bit combination read may be used to index the table structure that provides a decoded value and the actual number of significant bits the decoded variable length code contains. If the actual number of bits is less than the maximal number, then the bit steam may be adjusted in a way that allows the excess bits to be accessed during the decoding of the next variable length code. The disclosed method requires less memory than direct lookup decoding methods and is efficient for systems that support bit scan operations. Additionally, performance of the method exhibits less memory access overhead as compared to prior art methods using multiple lookup tables.

Reference in the specification to "one embodiment" or "an embodiment" of the present invention means that a particular feature, structure or characteristic described in connection with the embodiment is included in at least one embodiment of the present invention. Thus, the appearances of the phrase "in one embodiment" appearing in various places throughout the specification are not necessarily all referring to the same embodiment.

Figure 1:
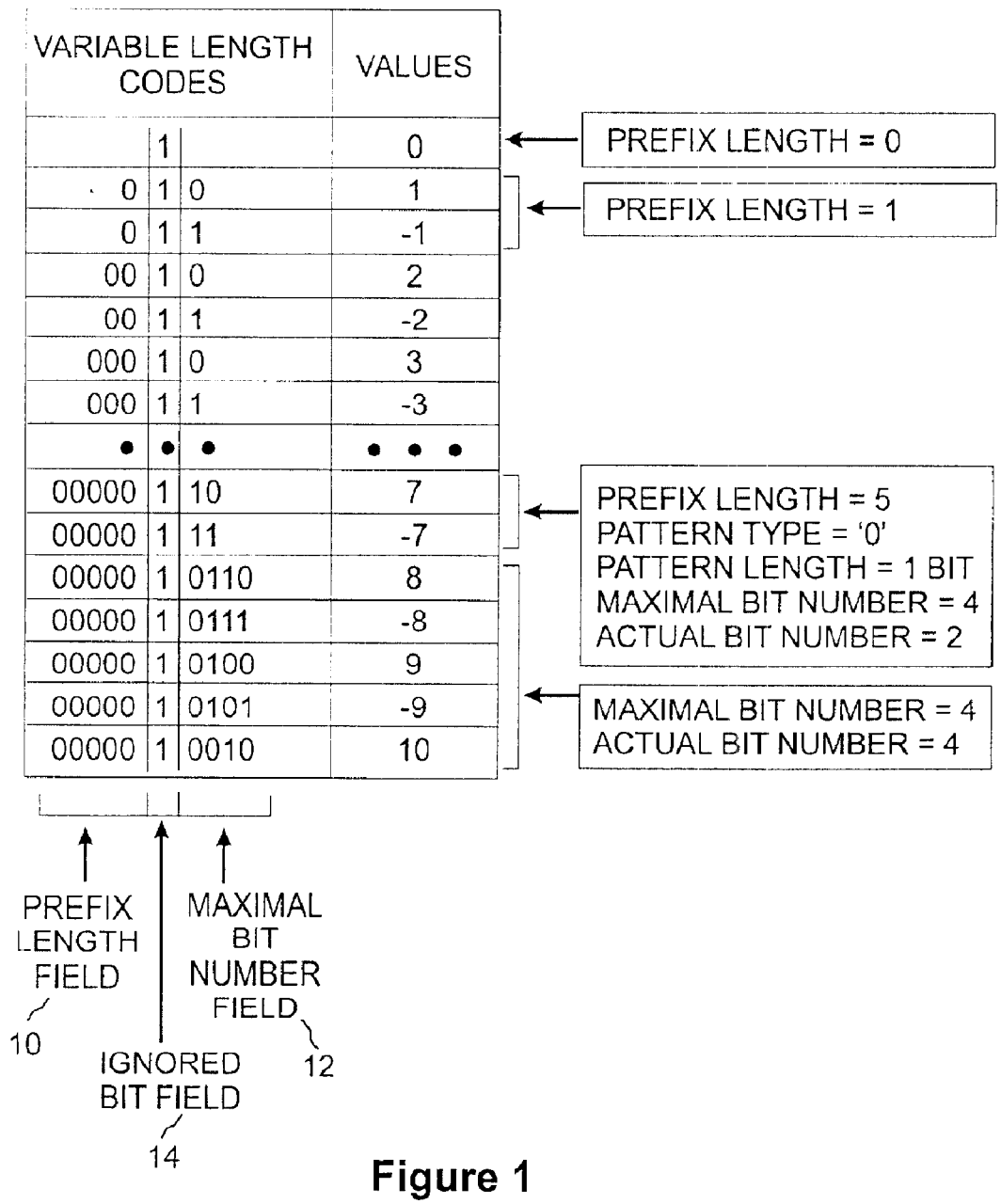
FIG. 1 is a diagram illustrating an exemplary variable length coding.

FIG. 1 is a diagram illustrating an exemplary variable length coding. As depicted by FIG. 1, each variable length code has a group of bits used as a prefix and a group of significant bits. The prefixes may be composed of a group of bits (bit patterns) that (in a general case) are replicated and concatenated to each other. For embodiments of the present invention, the number of bits that constitute such a bit pattern may be referred to as the bit pattern length, and the number of bits that constitute a prefix may be called prefix length 10 (which is equal to the number of bit pattern replications multiplied by the bit pattern length). The bits that follow the code prefix may be called significant bits.

Variable length codes (VLCs) may have identical prefixes. In this case, the codes constitute a prefix code group, but at the same time the number of significant bits that follow the prefix may differ. The maximal number of significant bits that is possible for a code in such a group may be referred to as the maximal bit number 12. The number of bits that follow the prefix for each VLC may be called the actual bit number.

If a VLC prefix is composed of 1-bit patterns (i.e., the only possible values for these 1-bit patterns are '0' and '1'), the bit 14 that immediately follows the prefix has no meaning to decoding (because the bit has a value that is always the inverse of the prefix bit pattern) and may be ignored. This allows embodiments of the present invention to reduce lookup storage memory requirements.

Figure 2:
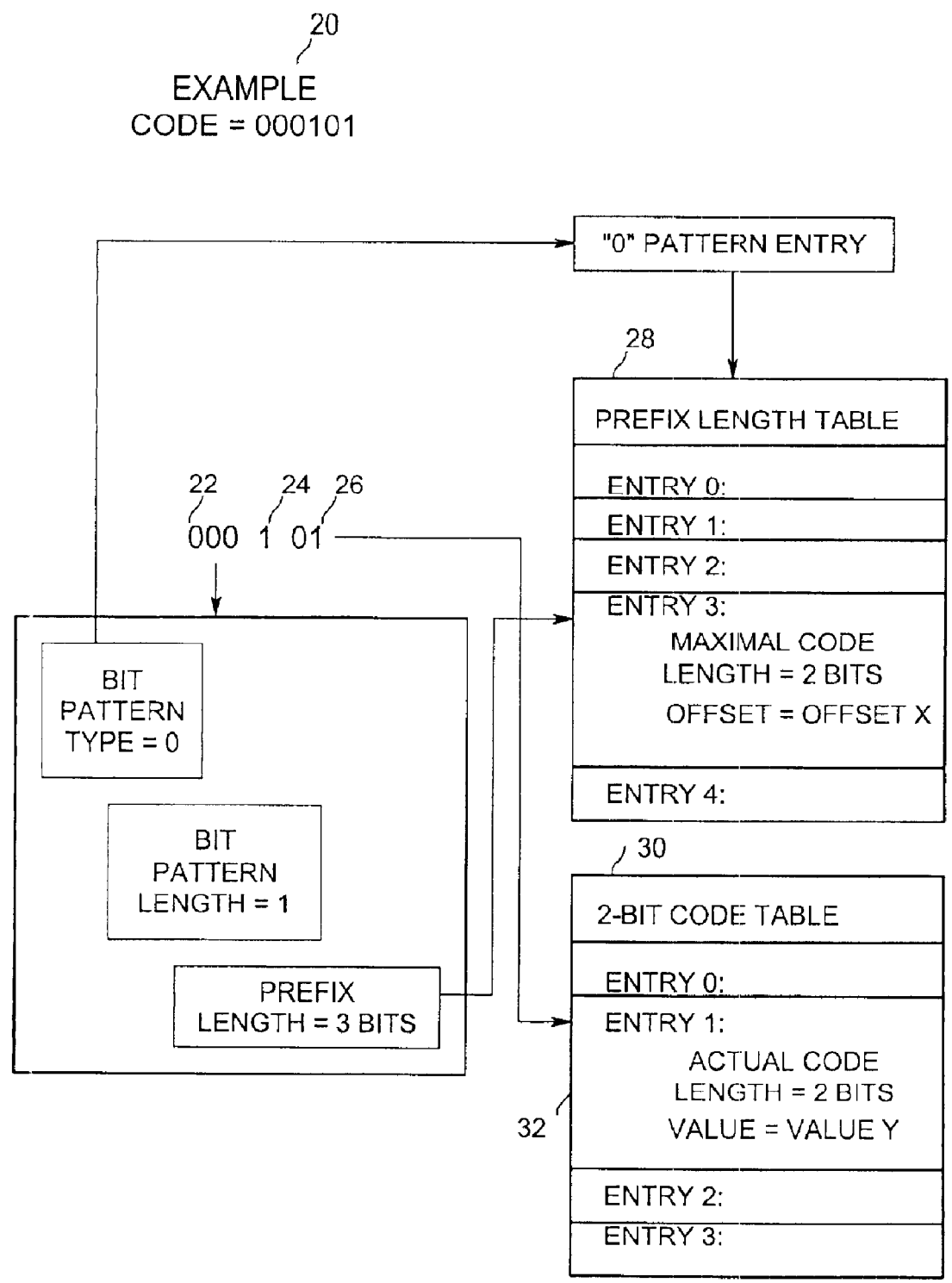
FIG. 2 is a diagram illustrating relations between code prefix type, code prefix length, bit combination value, and value associated with a variable length code in accordance with an embodiment of the present invention.

FIG. 2 is a diagram illustrating relations between code prefix type, code prefix length, bit combination value, and value associated with a variable length code in accordance with an embodiment of the present invention. As depicted in the example of FIG. 2, each variable length code 20 can be divided into a prefix 22, an ignored part 24, and a significant part 26 according to an embodiment of the present invention. A first data structure such as a table provided in accordance with the disclosed method corresponds to each bit pattern type that may constitute a VLC prefix. In one embodiment, the first data structure may be called a prefix length table 28. Each entry of the first data structure corresponds to the prefix length value and contains the maximal number of bits that may follow the bits of a VLC prefix or the ignore bit, if the ignore bit is present in a VLC. Along with the maximal bit number, each entry of the prefix length table provides an offset or another kind of reference to a second data structure such as a table having entries corresponding to all possible bit combinations that can be formed from the maximal number of bits. In one embodiment, the second data structure may be called a 2-bit code table 30. Each entry of the 2-bit code table stores the actual number of bits of the variable length code, composed of the prefix pointing (according to the provisions above) to the table that includes this entry, and comprising significant bits, the combination of which corresponds to this entry in the 2-bit code table. The value associated with the aforementioned variable length code can be obtained from the same entry 32 of the 2-bit code table 30.

Figure 3:
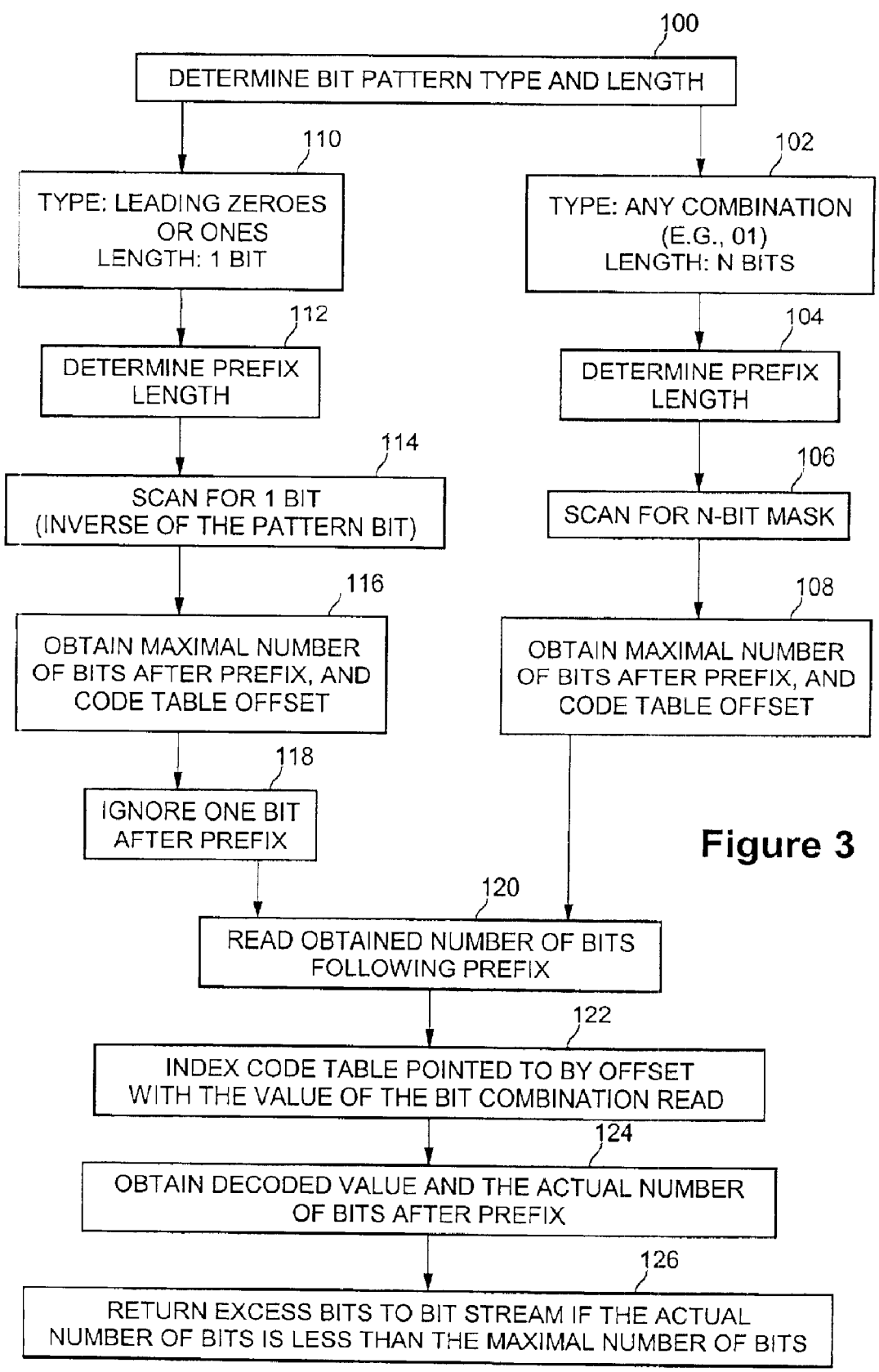
FIG. 3 is a flow diagram illustrating the variable length decoding process in accordance with an embodiment of the present invention.

FIG. 3 is a flow diagram illustrating a variable length decoding process in accordance with an embodiment of the present invention. At block 100, the type and length of the bit pattern that constitutes a code prefix may be determined by either testing an input bit sequence or by checking some external parameters that indicate the use of a predetermined bit pattern in the bit sequence. It may not be necessary to test the bit sequence for all possible pattern types. The bit sequence may be checked for the most probable (or the most easy-to-check) patterns, provided that the prefix length table for such patterns contain entries for those VLCs whose prefixes include the patterns as their sub-patterns.

If the bit pattern length is greater than 1 bit as shown in block 102, the prefix length may be determined 104 by scanning a bit stream for a bit mask equal to the determined bit pattern at block 106. This operation may be most efficient when implemented in systems that provide hardware support for bit mask scan operations. The retrieved prefix length serves as an index to the first table structure (e.g., the prefix length table) to obtain, at block 108, the maximal number of significant bits and an offset into the second table structure (e.g., the 2-bit code table) containing a decoded value.

If the bit pattern length is equal to 1 bit as shown in block 110, the prefix length may be determined 112 by scanning the bit stream for the inverse bit pattern at block 114. One efficient implementation of this operation uses bit scan hardware support (e.g., a 32-bit Intel Architecture (IA-32) BSR instruction). The retrieved prefix length serves as an index to obtain the maximal number of significant bits and offset at block 116 as described above for the multi-bit case. The bit that immediately follows the code prefix (the one the bit stream was scanned for) may be ignored at block 118.

Next, the obtained maximal number of bits that follow the prefix or the ignored bit may be read out of the bit stream at block 120. The second table structure (e.g., the 2-code table) entry pointed to by the obtained offset may be indexed, and the value of the bits in the entry read out at block 122. As a result, the actual number of bits the VLC being decoded contains and the VLC's associated (decoded) value may be obtained at block 124. If the actual number of bits appears to be less than the maximal number of bits read out, the bit stream may be adjusted at block 126 in a way that allows the excess bits to be processed upon the decoding of the next variable length code. In one embodiment, returning the excess bits may be accomplished by adjusting a bit stream pointer in a way that allows the bits of the bit stream to be further processed on decoding of a next variable length code.

For an exemplary embodiment of the present invention implemented in the C and Assembler programming languages, refer to Appendix A. Timing information for performance of the disclosed method is listed in Appendix B.

The techniques described herein are not limited to any particular hardware or software configuration; they may find applicability in any computing or processing environment. The techniques may be implemented in logic embodied in hardware, software, or firmware components, or a combination of the above. The techniques may be implemented in programs executing on programmable machines such as mobile or stationary computers, personal digital assistants, set top boxes, cellular telephones and pagers, and other electronic devices, that each include a processor, a storage medium readable by the processor (including volatile and non-volatile memory and/or storage elements), at least one input device, and one or more output devices. Program code is applied to the data entered using the input device to perform the functions described and to generate output information. The output information may be applied to one or more output devices. One of ordinary skill in the art may appreciate that the invention can be practiced with various computer system configurations, including multiprocessor systems, minicomputers, mainframe computers, and the like. The invention can also be practiced in distributed computing environments where tasks may be performed by remote processing devices that are linked through a communications network.

Each program may be implemented in a high level procedural or object oriented programming language to communicate with a processing system. However, programs may be implemented in assembly or machine language, if desired. In any case, the language may be compiled or interpreted.

Program instructions may be used to cause a general-purpose or special-purpose processing system that is programmed with the instructions to perform the operations described herein. Alternatively, the operations may be performed by specific hardware components that contain hard-wired logic for performing the operations, or by any combination of programmed computer components and custom hardware components. The methods described herein may be provided as a computer program product that may include a machine readable medium having stored thereon instructions that may be used to program a processing system or other electronic device to perform the methods. The term "machine readable medium" used herein shall include any medium that is capable of storing or encoding a sequence of instructions for execution by the machine and that cause the machine to perform any one of the methods described herein. The term "machine readable medium" shall accordingly include, but not be limited to, solid-state memories, optical and magnetic disks, and a carrier wave that encodes a data signal. Furthermore, it is common in the art to speak of software, in one form or another (e.g., program, procedure, process, application, module, logic, and so on) as taking an action or causing a result. Such expressions are merely a shorthand way of stating the execution of the software by a processing system cause the processor to perform an action of produce a result.

While this invention has been described with reference to illustrative embodiments, this description is not intended to be construed in a limiting sense. Various modifications of the illustrative embodiments, as well as other embodiments of the invention, which are apparent to persons skilled in the art to which the inventions pertains are deemed to lie within the spirit and scope of the invention.

What is claimed is:

1. In a system for decoding variable length codes in a bit stream, the variable length codes having prefixes of a regular bit pattern, a method comprising:
   determining a bit pattern type of a code prefix, a bit pattern length, and a code prefix length;
   obtaining, from a first data structure, a maximal code length and an offset into a second data structure according to the code prefix length and bit pattern type;
   reading, from the bit stream, the number of bits immediately following the code prefix equal to the maximal code length; and
   obtaining a decoded value and actual code length associated with the variable length code from an entry in the second data structure referenced by the offset.

2. The method of claim 1, further comprising ignoring one bit immediately following the code prefix when the bit pattern length is one bit.

3. The method of claim 2, wherein returning the excess bits further comprises adjusting a bit stream pointer in a way that allows the bits of the bit stream to be further processed on decoding of a next variable length code.

4. The method of claim 1, further comprising returning excess bits to the bit stream when the actual code length is less than the maximal code length.

5. The method of claim 1, wherein determining the bit pattern type comprises checking whether a variable length code prefix is composed of zero bits, one bits, or a pre-defined n-bit regular combination.

6. The method of claim 1, wherein determining the bit pattern length comprises retrieving the number of bits of the bit pattern that was used to constitute the code prefix.

7. The method of claim 1, wherein determining the code prefix length comprises retrieving an actual variable length code prefix length by scanning the code prefix for at least one of a set bit, a cleared bit, or a regular bit pattern, the actual length being the bit position resulted from the scanning operation.

8. The method of claim 1, wherein the first data structure used to obtain the maximal code length and the offset comprises a memory area indexed with predefined code prefix length and bit pattern type values.

9. The method of claim 1, wherein the second data structure used to obtain the decoded value and actual code length associated with the variable length code comprises a memory area pointed to by the offset, and indexed by bit combinations formed from the maximal number of bits.

10. An article comprising: a machine accessible medium having a plurality of machine readable instructions, wherein when the instructions are executed by a processor, the instructions provide for decoding variable length codes in a bit stream, the variable length codes having prefixes of a regular bit pattern, by
   determining a bit pattern type of a code prefix, a bit pattern length, and a code prefix length;
   obtaining, from a first data structure, a maximal code length and an offset into a second data structure according to the code prefix length and bit pattern type;
   reading, from the bit stream, the number of bits immediately following the code prefix equal to the maximal code length; and
   obtaining a decoded value and actual code length associated with the variable length code from an entry in the second data structure referenced by the offset.

11. The article of claim 10, further comprising instructions for ignoring one bit immediately following the code prefix when the bit pattern length is one bit.

12. The article of claim 11, wherein instructions for returning the excess bits further comprise instructions for adjusting a bit stream pointer in a way that allows the bits of the bit stream to be further processed on decoding of a next variable length code.

13. The article of claim 10, further comprising instructions for returning excess bits to the bit stream when the actual code length is less than the maximal code length.

14. The article of claim 10, wherein instructions for determining the bit pattern type comprise instructions for checking whether a variable length code prefix is composed of zero bits, one bits, or a pre-defined n-bit regular combination.

15. The article of claim 10, wherein instructions for determining the bit pattern length comprise instructions for retrieving the number of bits of the bit pattern that was used to constitute the code prefix.

16. The article of claim 10, wherein instructions for determining the code prefix length comprise instructions for retrieving an actual variable length code prefix length by scanning the code prefix for at least one of a set bit, a cleared bit, or a regular bit pattern, the actual length being the bit position resulted from the scanning operation.

17. The article of claim 10, wherein the first data structure used to obtain the maximal code length and the offset comprises a memory area indexed with predefined code prefix length and bit pattern type values.

18. The article of claim 10, wherein the second data structure used to obtain the decoded value and actual code length associated with the variable length code comprises a memory area pointed to by the offset, and indexed by bit combinations formed from the maximal number of bits.

19. A system for decoding variable length codes in a bit stream, the variable length codes having prefixes of a regular bit pattern, comprising:

logic to determine a bit pattern type of a code prefix, a bit pattern length, and a code prefix length;

logic to obtain, from a first data structure, a maximal code length and an offset into a second data structure according to the code prefix length and bit pattern type;

logic to read, from the bit stream, the number of bits immediately following the code prefix equal to the maximal code length; and logic to obtain a decoded value and actual code length associated with the variable length code from an entry in the second data structure referenced by the offset.

20. The system of claim 19, further comprising logic to ignore one bit immediately following the code prefix when the bit pattern length is one bit.

21. The system of claim 20, wherein logic to return the excess bits further comprises logic to adjust a bit stream pointer in a way that allows the bits of the bit stream to be further processed on decoding of a next variable length code.

22. The system of claim 19, further comprising logic to return excess bits to the bit stream when the actual code length is less than the maximal code length.

23. The system of claim 19, wherein logic to determine the bit pattern type comprises logic to check whether a variable length code prefix is composed of zero bits, one bits, or a pre-defined n-bit regular combination.

24. The system of claim 19, wherein logic to determine the bit pattern length comprises logic to retrieve the number of bits of the bit pattern that was used to constitute the code prefix.

25. The system of claim 19, wherein logic to determine the code prefix length comprises logic to retrieve an actual variable length code prefix length by scanning the code prefix for at least one of a set bit, a cleared bit, or a regular bit pattern, the actual length being the bit position resulted from the scanning operation.

26. The system of claim 19, wherein the first data structure used to obtain the maximal code length and the offset comprises a memory area indexed with predefined code prefix length and bit pattern type values.

27. The system of claim 19, wherein the second data structure used to obtain the decoded value and actual code length associated with the variable length code comprises a memory area pointed to by the offset, and indexed by bit combinations formed from the maximal number of bits.

* * * * *